(12) United States Patent
Liu et al.

(10) Patent No.: US 8,116,115 B2
(45) Date of Patent: Feb. 14, 2012

(54) MULTILEVEL PHASE CHANGE MEMORY OPERATION

(75) Inventors: Jun Liu, Boise, ID (US); Wenzhou Chen, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 513 days.

(21) Appl. No.: 12/266,447

(22) Filed: Nov. 6, 2008

(65) Prior Publication Data

US 2010/0110779 A1    May 6, 2010

(51) Int. Cl.
*G11C 11/00* (2006.01)

(52) U.S. Cl. ........................................ 365/148; 365/113

(58) Field of Classification Search .................. 365/148, 365/113, 163
See application file for complete search history.

(56) References Cited

U.S. PATENT DOCUMENTS

| | | | |
|---|---|---|---|
| 6,473,332 B1 | 10/2002 | Ignatiev et al. | |
| 6,813,177 B2 * | 11/2004 | Lowrey et al. | 365/148 |
| 7,126,846 B2 * | 10/2006 | Ha et al. | 365/163 |
| 7,515,459 B2 * | 4/2009 | Kang et al. | 365/163 |
| 2006/0221679 A1 | 10/2006 | Kang et al. | |
| 2007/0189065 A1 | 8/2007 | Suh et al. | |
| 2007/0280023 A1 | 12/2007 | Happ et al. | |
| 2008/0084738 A1 | 4/2008 | Philipp et al. | |
| 2008/0123389 A1 | 5/2008 | Cho et al. | |
| 2008/0130351 A1 | 6/2008 | Nirschi | |
| 2008/0135824 A1 | 6/2008 | Lai et al. | |
| 2008/0137401 A1 | 6/2008 | Philipp et al. | |
| 2008/0151613 A1 | 6/2008 | Chao et al. | |
| 2008/0180989 A1 | 7/2008 | Baek et al. | |
| 2008/0212363 A1 | 9/2008 | Fuji | |

FOREIGN PATENT DOCUMENTS

EP    1 881 539 A2    1/2008

OTHER PUBLICATIONS

Happ, T.D., et al. "Novel One-Mask Self-Heating Pillar Phase Change Memory," 2006 IEEE Symposium on VLSI Technology Digest of Technical Papers (Aug. 2006).

* cited by examiner

*Primary Examiner* — Vu Le
(74) *Attorney, Agent, or Firm* — Brooks, Cameron & Huebach, PLLC

(57) ABSTRACT

Methods, devices, and systems associated with multilevel phase change memory cells are described herein. One or more embodiments of the present disclosure include operating a phase change memory device by placing a phase change memory cell in a reset state and applying a selected programming pulse to the phase change memory cell in order to program the cell to one of a number of intermediate states between the reset state and a set state associated with the cell. The selected programming pulse includes an uppermost magnitude applied for a particular duration, the particular duration depending on to which one of the number of intermediate states the memory cell is to be programmed.

24 Claims, 8 Drawing Sheets

MULTILEVEL PHASE CHANGE MEMORY OPERATION

TECHNICAL FIELD

The present disclosure relates generally to semiconductor memory devices and methods, and more particularly, to multilevel phase change memory operation.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among other types of memory.

Resistance variable memory devices, such as PCRAM devices, can include a structural phase change material such as a chalcogenide alloy, for instance, which can be programmed into different resistivity states to store data. The phase change memory cells are nonvolatile and the particular data stored in a phase change memory cell can be read by sensing the cell's resistance, e.g., by sensing current and/or voltage variations based on the resistance of the phase change material.

In cases in which the resistance variable memory device includes a chalcogenide alloy, the chalcogenide alloy can exhibit a reversible structural phase change, e.g., from amorphous to crystalline. A small volume of the chalcogenide alloy can be integrated into a circuit that can allow the cell to act as a fast switching programmable resistor. This programmable resistor can exhibit greater than 40 times the dynamic range of resistivity between the crystalline state (low resistivity) and the amorphous state (high resistivity), and is also capable of exhibiting multiple intermediate states that allow multi-bit storage in each cell. That is, resistance variable memories may achieve multi-level cell (MLC) functionality via programming of memory cells to one of a number of different resistance levels.

Multilevel programming of phase change memory cells can be challenging due to factors such as the sensitivity of the cells to applied programming pulses. For instance, it can be difficult to provide adequate separation between adjacent intermediate resistance states, e.g., resistance states between the amorphous state and the crystalline state, due to a rapid transition which can occur between the amorphous and crystalline states during programming. Inadequate separation between adjacent states can lead to problems such as data read errors.

DETAILED DESCRIPTION

Figure 1:
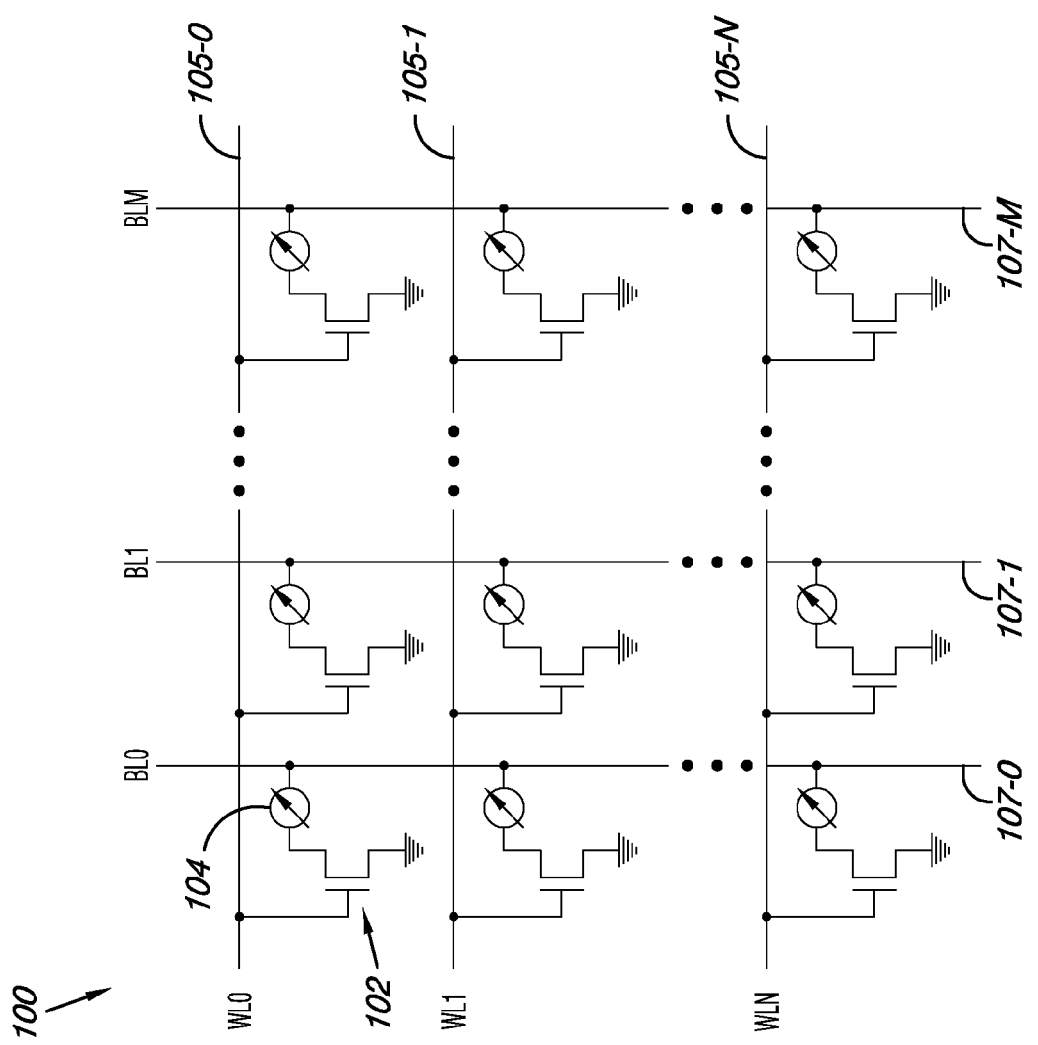
FIG. 1 is a schematic of a portion of a phase change memory array that can be used in accordance with one or more embodiments of the present disclosure.

Methods, devices, and systems associated with multilevel phase change memory cells are described herein. One or more embodiments of the present disclosure include operating a phase change memory device by placing a phase change memory cell in a reset state and applying a selected programming pulse to the phase change memory cell in order to program the cell to one of a number of intermediate states between the reset state and a set state associated with the cell. The selected programming pulse includes an uppermost magnitude applied for a particular duration, the particular duration depending on to which one of the number of intermediate states the memory cell is to be programmed.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicate that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

FIG. 1 is a schematic of a portion of a phase change memory array 100 that can be used in accordance with one or more embodiments of the present disclosure. In the embodiment illustrated in FIG. 1, the memory array 100 includes a number of phase change memory cells each having an associated access device 102 and resistance variable element 104, e.g., a phase change material 104. The access devices 102 can be operated, e.g., turned on/off, to access the memory cells in order to perform operations such as data programming, e.g., writing, and/or data reading operations on the resistance variable elements 104.

In the embodiment illustrated in FIG. 1, the access devices 102 are metal oxide semiconductor field effect transistors (MOSFETs). As shown in FIG. 1, a gate of each MOSFET 102 associated with each memory cell is coupled to one of a number of access lines 105-0 (WL0), 105-1 (WL1), . . . , 105-N (WLN), i.e., each access line 105-0, 105-1, . . . , 105-N is coupled to a row of phase change memory cells. The access lines 105-0, 105-1, . . . , 105-N may be referred to herein as "word lines." The designator "N" is used to indicate that a memory array can include a number of access lines. The resistance variable elements 104 can be a phase change chalcogenide alloy such as a Germanium-Antimony-Tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include Ge—Te, Ge—Sb, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

In the embodiment illustrated in FIG. 1, each resistance variable element 104 is coupled to one of a number of data lines 107-0 (BL0), 107-1 (BL1), . . . , 107-M (BLM), i.e., each data line 107-0, 107-1, . . . , 107-M is coupled to a column of phase change memory cells. The data lines 107-0, 107-1, . . . , 107-M may be referred to herein as "bit lines." The designator "M" is used to indicate that a memory array can include a number of data lines. For ease of addressing in the digital environment, the number of word lines 105-1, . . . , 105-N and the number of bit lines 107-1, . . . , 107-M can each be some power of two, e.g., 256 word lines by 4,096 bit lines. However, embodiments are not limited to particular numbers of word lines and/or bit lines.

In operation, appropriate voltage and/or current signals, e.g., pulses, can be applied to the bit lines and word lines in order to program data to and/or read data from the phase change memory cells of the array 100. As an example, the data stored by a phase change memory cell of array 100 can be determined by turning on an access device, e.g., 102, and sensing a current passing through the phase change element, e.g., 104. The current sensed on the bit line associated with the memory cell being read corresponds to a resistance level of the phase change element 104, which in turn corresponds to a particular data value, e.g., a binary value such as 1, 0, 01, 11, 001, 111, 1011, etc.

Embodiments of the present disclosure are not limited to the example array 100 illustrated in FIG. 1. For example, as one of ordinary skill in the art will appreciate, the access device 102 associated with a particular memory cell can be a device other than a MOSFET. In some embodiments, the access device 102 can be a bipolar junction transistor (BJT) or a diode, among other types of access devices. Also, a memory array, e.g., 100, can have an architecture other than that illustrated in FIG. 1, as will be understood by one of ordinary skill in the art.

In one or more embodiments, a number of phase change memory cells in the array 100 can be used as reference phase change reference cells. In such embodiments, the reference cells can be used in operation of a phase change memory device in accordance with one or more embodiments as described herein below. In embodiments in which the array 100 includes reference cells, the reference cells can be physically the same as the other phase change memory cells, e.g., memory cells used to store user data, although embodiments are not so limited. In one or more embodiments, the phase change memory cells of array 100 can be used as both reference cells and data cells.

Figure 2:
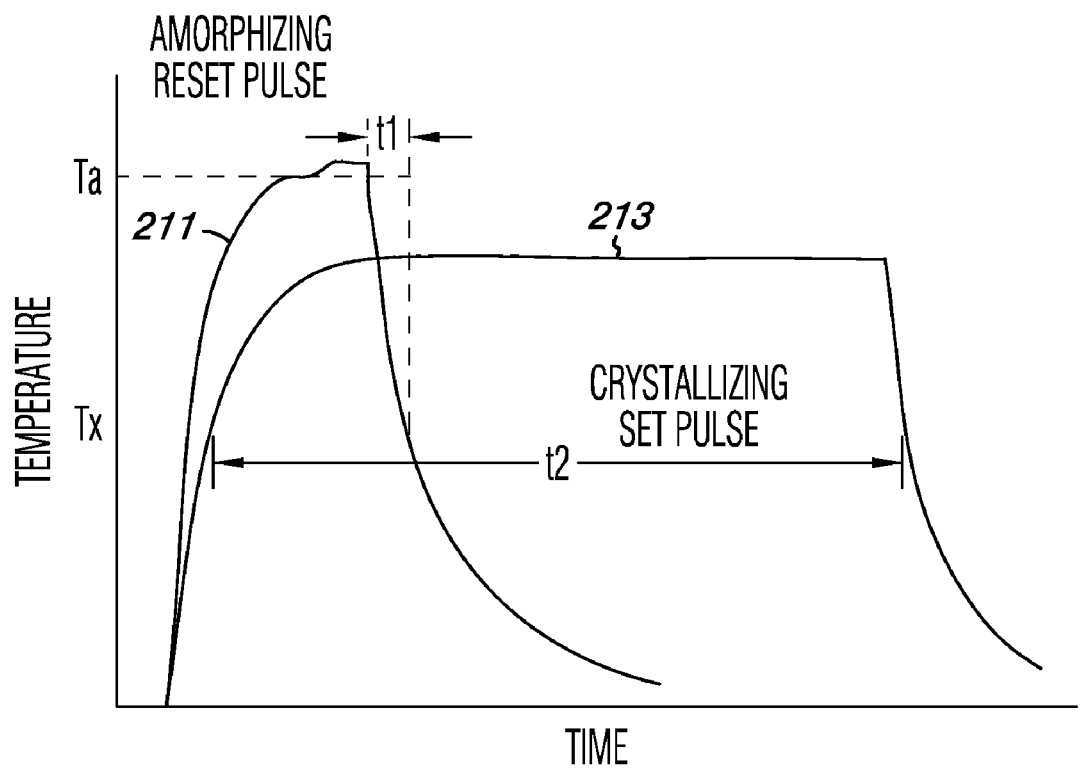
FIG. 2 illustrates a graph of prior art temperature pulse characteristics of a phase change material during programming of a phase change memory cell in accordance with a previous approach.

FIG. 2 illustrates a graph of prior art temperature pulse characteristics of a phase change material during programming of a phase change memory cell in accordance with a previous approach. In FIG. 2, the pulse 211 represents a temperature pulse of a cell being programmed to an amorphous (high resistivity) state, e.g., a cell having an amorphizing (reset) pulse applied thereto. The pulse 213 represents a temperature pulse of a cell being programmed to a crystalline (low resistivity) state, e.g., a cell having a crystallizing (set) pulse applied thereto. The reset pulse and the set pulse can be applied to a particular memory cell in order to alter the resistance of the phase change element, e.g., phase change element 104 shown in FIG. 1, by raising/lowering the temperature of the phase change material corresponding to the cell in a manner such that the resistance of the cell is changed, e.g., programmed, to a value that corresponds to a particular desired data state.

As one of ordinary skill in the art will appreciate, a reset pulse, e.g., a pulse resulting in a temperature pulse such as pulse 211, can be used to place the phase change material, or a portion thereof, in an amorphous state corresponding to a high resistance value, e.g., about 100 kiloOhm to about 1 megaOhm. For instance, as shown by temperature pulse 211, the reset pulse can be used to raise the temperature of the phase change material to a temperature Ta sufficient to melt the phase change material. The phase change material cools over a short time period, i.e., t1, to amorphize the phase change material such that the phase change material does not re-form some portion of its internal crystalline structure. The time t1 can be referred to as a "quenching time."

A set pulse, e.g., a pulse resulting in a temperature pulse such as set pulse 213 illustrated in FIG. 2, can be used to raise the temperature of a phase change material above a temperature Tx and maintain the temperature of the phase change material for a time, e.g., t2, sufficient to allow crystallization of the phase change material to occur. As such, the set pulse can place the phase change material in a crystalline state corresponding to a low resistance value, e.g., about 1 kiloOhm to about 10 kiloOhm, for instance.

The set pulse and reset pulse applied to phase change memory cells and resulting in the temperature curves 213 and 211, respectively, can be rectangularly shaped pulses. That is, the set and reset pulses can be fixed amplitude pulses with short rising and falling edges. The set and reset pulses can be current pulses or voltage pulses applied to the cell to achieve temperature pulse characteristics such as those shown in FIG. 2. As one of ordinary skill in the art will appreciate, the reset pulse used to place the cell in a reset state can have a larger magnitude and shorter duration as compared with the set pulse used to place the cell in the set state.

As described further herein, one or more embodiments of the present disclosure can be used to program phase change memory cells to multiple intermediate resistance states between the high resistance reset state and the low resistance set state associated with the phase change memory cells. Embodiments of the present disclosure can include using programming pulses having different durations. The different durations of the programming pulses can depend on to which of the number of intermediate states the memory cell is to be programmed. Using programming pulses have different durations can provide benefits such as higher bit density by and improved programming consistency as compared with previous multilevel programming approaches. Examples of prior art approaches for programming phase change memory cells to intermediate states are described below in connection with FIGS. 3A, 3B, and 4.

Figure 3A:
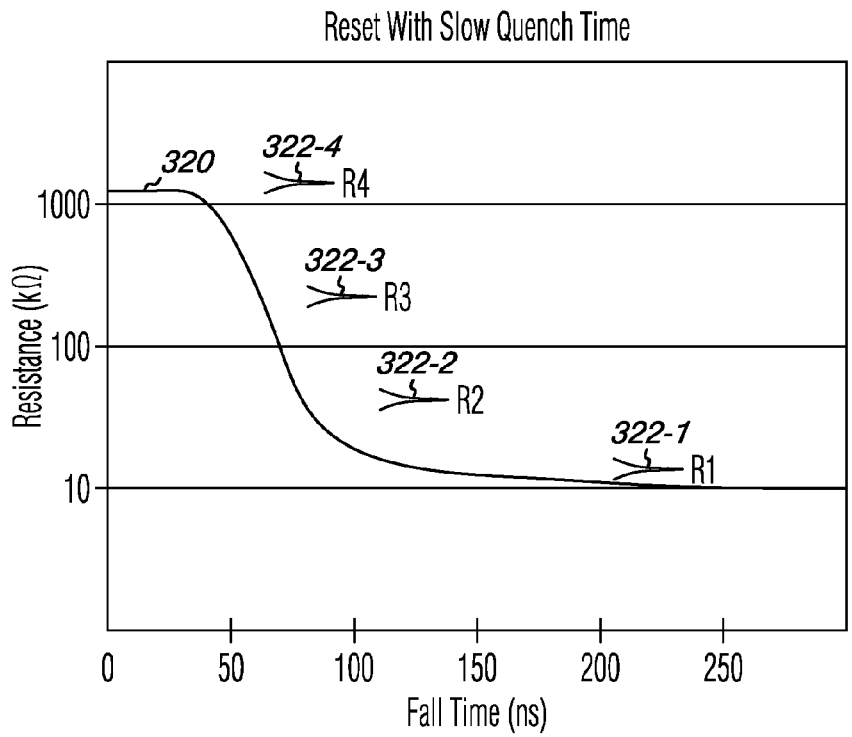
FIG. 3A illustrates multiple resistance states achieved via a prior art multilevel programming approach.
Figure 3B:
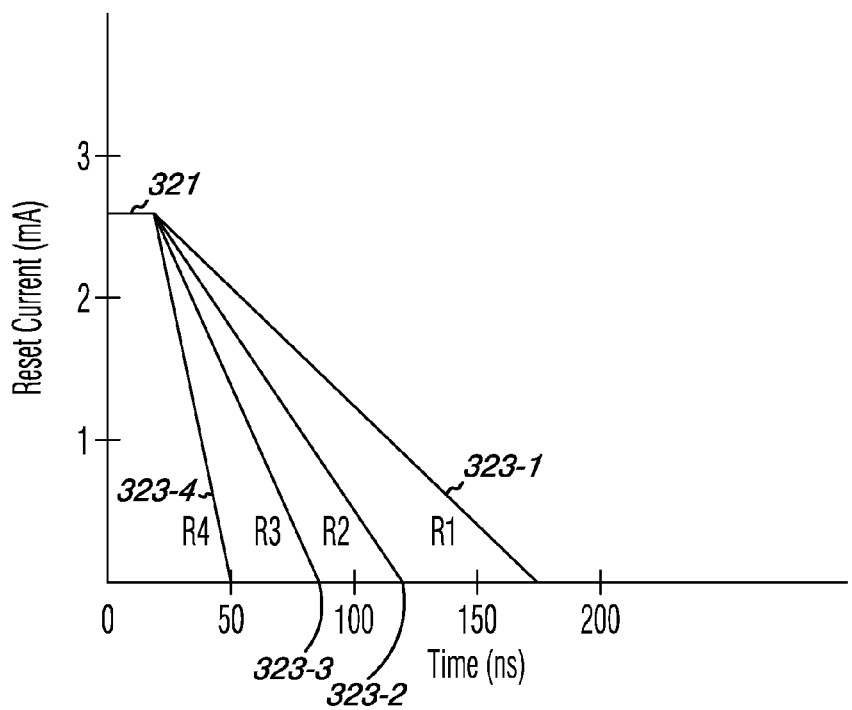
FIG. 3B illustrates a reset programming pulse having different trailing edge fall times associated with the prior art multilevel programming approach illustrated in FIG. 3A.

FIG. 3A illustrates multiple resistance states achieved via a prior art multilevel programming approach. FIG. 3B illustrates a reset programming pulse having different trailing edge fall times, e.g., quench times, associated with the prior art multilevel programming approach illustrated in FIG. 3A. The prior art programming approach illustrated in FIGS. 3A and 3B involves applying a reset pulse to the cell to amorphize the phase change material. In such previous approaches, the programmed resistance of the cell can depend on the fall time associated with the trailing edge of the reset pulse.

In the example shown in FIGS. 3A and 3B, the reset current pulse used to program a cell to one of the resistance states 322-1 (R1), 322-2 (R2), 322-3 (R3), and 322-4 (R4) includes a fixed portion 321 having a fixed magnitude and duration as well as a trailing portion whose duration is varied depending on the particular resistant state to which the cell is to be programmed. As illustrated in FIGS. 3A and 3B, the fall time, e.g., quench time, associated with the trailing edges 323-1, 323-2, 323-3, and 323-4 increases for lower resistance states, e.g., resistance states corresponding to lower resistance levels.

In the example illustrated in FIGS. 3A and 3B, the resistance state 322-1 (R1) corresponds to the set state of the cell, e.g., a lowermost crystalline state, while the resistance state 322-4 (R4) corresponds to the reset state of the cell, e.g., an uppermost amorphous state. As illustrated by curve 320 shown in FIG. 3A, the resistance of the cell being programmed changes rapidly with quench time for resistance levels between the set and reset states. As such, it can be difficult to provide multiple intermediate resistance states such as 322-2 (R2) and 322-3 (R3). For instance, small fluctuations in the quench time can cause widening of the resistance distributions associated with the intermediate states, e.g., 322-2 and 322-3, due to an inability to accurately program the cells. Also, wider resistance distributions can cause overlap such that it is difficult to distinguish between states, which can lead to data read errors.

Figure 4:
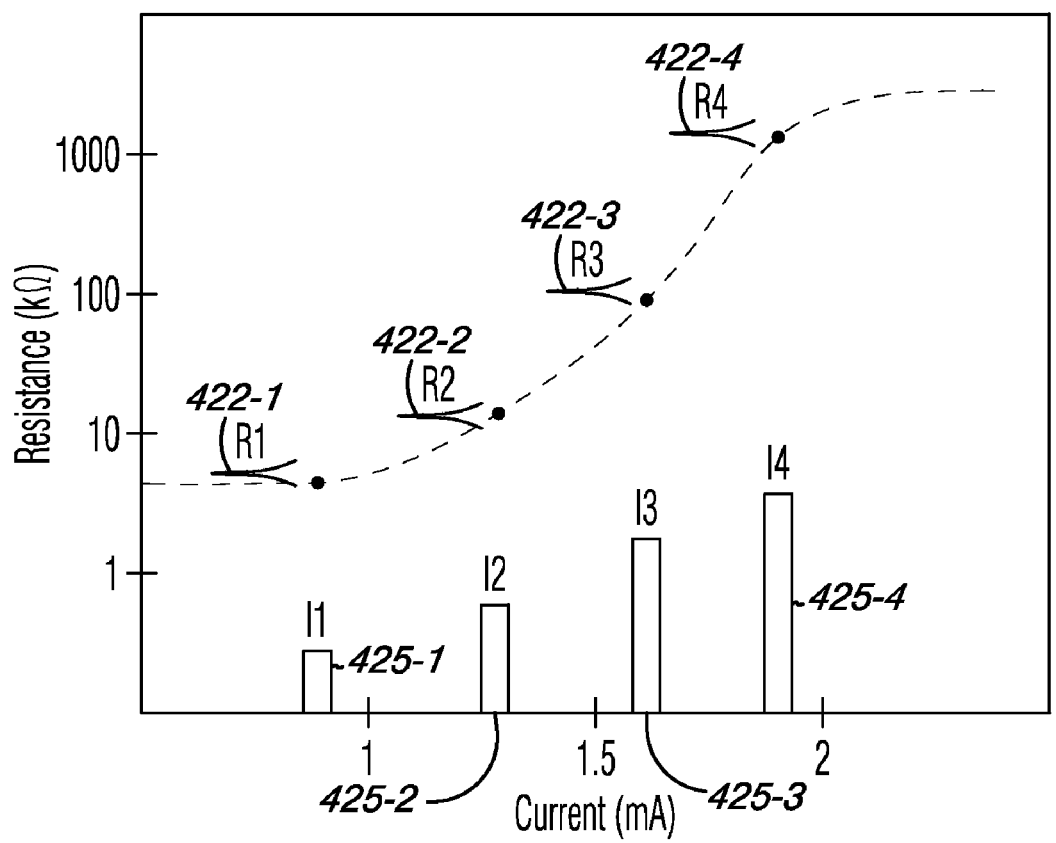
FIG. 4 illustrates multiple resistance levels achieved via another prior art multilevel programming approach.

FIG. 4 illustrates multiple resistance levels achieved via another prior art multilevel programming approach. In the programming approach described in connection with FIG. 4, the phase change memory cells are first programmed to a set state, e.g., a fully crystalline state, prior to having a programming pulse applied to adjust the resistance level of the cell to a resistance level corresponding to a desired program state, e.g., 422-1 (R1), 422-2 (R2), 422-3 (R3), and 422-4 (R4).

FIG. 4 illustrates a number of programming pulses 425-1 (I1), 425-2 (I2), 425-3 (I3), and 425-4 (I4), each corresponding to a respective one of the program states 422-1, 422-2, 422-3, and 422-4. In this example, the programming pulses are current pulses, but as one of ordinary skill in the art will appreciate, the programming pulses could also be voltage pulses applied to the phase change memory cells.

As illustrated in FIG. 4, the amplitude of the individual programming pulses is different for each of pulses 425-1, 425-2, 425-3, and 425-4. That is, the uppermost magnitude of the programming pulse is larger for pulses used to program the phase change memory cell to higher resistance levels. However, the pulses 425-1, 425-2, 425-3, and 425-4 each have the same duration, e.g., pulse width. That is, the duration for which the uppermost magnitude of the pulse is applied to the memory cell is the same for each of the pulses 425-1, 425-2, 425-3, and 425-4. Unlike the programming pulses in the prior art programming approach described in FIGS. 3A and 3B above, the pulses 425-1, 425-2, 425-3, and 425-4 have a fast falling edge, e.g., an undelayed falling edge.

The programming approach described in FIG. 4 can be referred to as "partial reset" programming because the memory cells are programmed from the set state to a resistance state between the set state and the reset state of the cells. As such, programming pulses such as pulses 425-1, 425-2, 425-3, and 425-4, can be referred to as partial reset pulses.

In the example prior art programming approach illustrated in FIG. 4, the resistance state 422-1 (R1) corresponds to the set state of the cell, e.g., the lowermost crystalline state, while the resistance state 422-4 (R4) corresponds to the reset state of the cell, e.g., an uppermost amorphous state. Since the example programming approach illustrated in FIG. 4 includes operating the phase change memory cells in the rapidly rising portion of the partial reset curve, it can be difficult to provide multiple intermediate resistance states such as 422-2 (R2) and 422-3 (R3). For instance, small fluctuations in the programming pulse amplitude can result in widening of the resistance distributions associated with the intermediate states, e.g., 422-2 and 422-3, due to an inability to accurately program the cells. This can lead to a reduction in the storage density associated with the cell and can lead to data read errors.

Figure 5A:
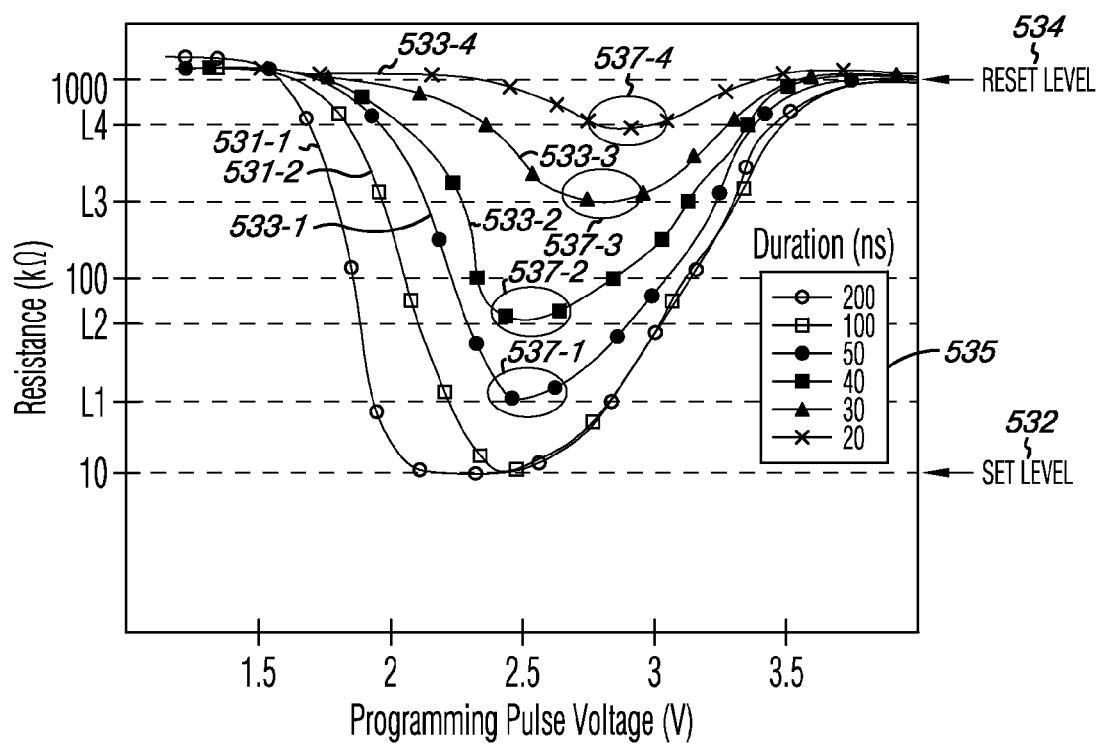
FIG. 5A is a graph illustrating resistance versus programming pulse voltage for a number of different programming pulse durations that can be used with one or more embodiments of the present disclosure.
Figure 5B:
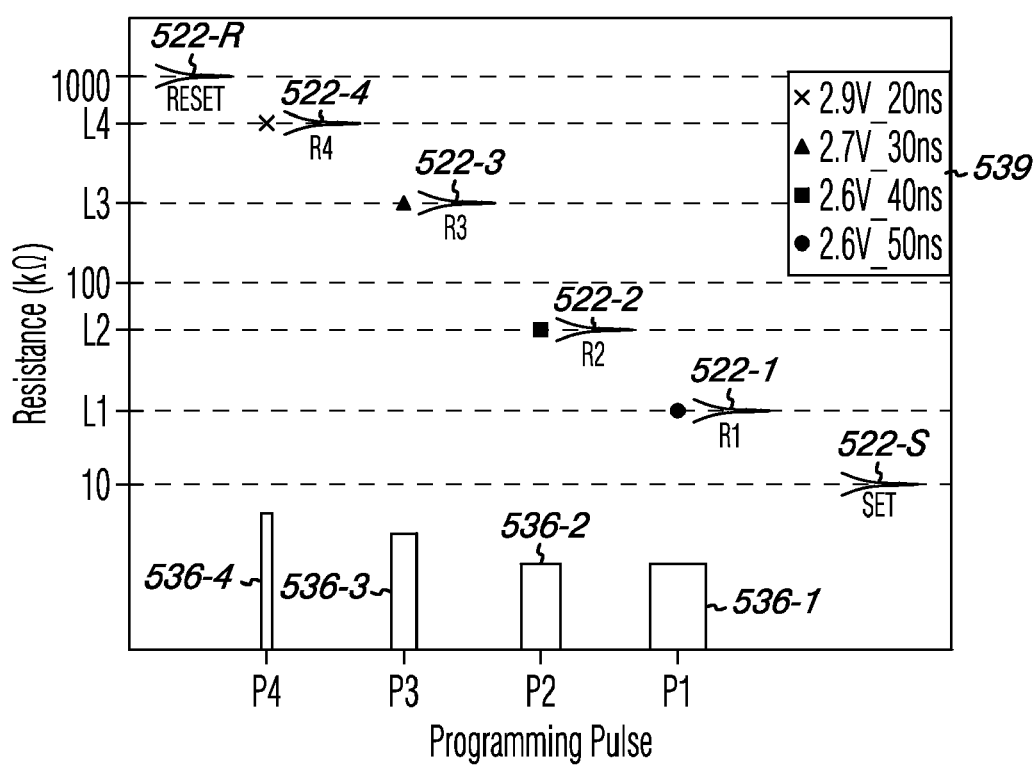
FIG. 5B illustrates a number of programming pulses and corresponding intermediate resistance states in accordance with one or more embodiments of the present disclosure.

FIG. 5A is a graph illustrating resistance versus programming pulse voltage for a number of different programming pulse durations that can be used with one or more embodiments of the present disclosure. FIG. 5B illustrates a number of programming pulses 536-1 (P1), 536-2 (P2), 536-3 (P3), and 536-4 (P4) and corresponding intermediate resistance states 522-1 (R1), 522-1 (R2), 522-3 (R3), and 522-4 (R4) in accordance with one or more embodiments of the present disclosure. As illustrated in FIG. 5B, the intermediate resistance states are located between a reset state 522-R (RESET), e.g., a fully amorphous state, and a set state 522-S (SET), e.g., a fully crystalline state, associated with an array of phase change memory cells. In one or more embodiments, the number of intermediate resistance states is at least three. However, embodiments are not so limited. For instance, in one or more embodiments, the number of intermediate states between a set state, e.g., 522-S, and a reset state, e.g., 522-R, can be one or two. As described further below and as shown in FIG. 5B, in one or more embodiments of the present disclosure, each of the programming pulses P1, P2, P3, and P4 have a different duration, e.g., a different pulse width.

The graph shown in FIG. 5A illustrates a number of curves 531-1, 5313-2, 533-1, 533-2, 533-3, and 533-4 representing experimentally obtained data points associated with applying programming pulses having a particular duration to a phase change memory cell at a number of different fixed magnitudes. In the example illustrated in FIG. 5A, the values for the number of different fixed magnitudes of the applied programming pulses range from between about 1 Volt to about 4 Volts.

As an example, as shown in legend 535, curve 531-1 represents data points resulting from 200 ns programming pulses applied to a phase change memory cell at a number of different fixed voltages. Curve 531-2 represents data points resulting from 100 ns programming pulses applied to the cell at a number of different fixed voltages. Curve 533-1 represents data points resulting from 50 ns programming pulses applied to the cell at a number of different fixed voltages. Curve 533-2 represents data points resulting from 40 ns programming pulses applied to the cell at a number of different fixed voltages. Curve 533-3 represents data points resulting from 30 ns programming pulses applied to the cell at a number of different fixed voltages. Curve 533-4 represents data points resulting from 20 ns programming pulses applied to the cell at a number of different fixed voltages.

As illustrated in FIG. 5A, for each different programming pulse duration, the resistance of the phase change memory cell transitions from an uppermost resistance level, i.e., reset level 534, to a lowermost resistance level and then back to the uppermost resistance level 534 over the programming pulse voltage range. As such, each of the curves 531-1, 531-2, 533-1, 533-2, 533-3, and 533-4 have an associated lowermost resistance level. For instance, the lowermost resistance level associated with curve 531-1 (the 200 ns pulse) and the lowermost resistance level associated with curve 531-2 (the 100 ns pulse) correspond to the set level 532, e.g., a resistance corresponding to a fully crystalline set state of the cell.

For each of the other pulse durations depicted in FIG. 5A, e.g., the pulse durations less than 100 ns, the lowermost resistance level associated with the corresponding curves 533-1, 533-2, 533-3, and 533-4, is at a level greater than the set level 532, e.g., at a resistance level between the set level 532 and the reset level 534. For instance, as illustrated in FIG. 5A, the lowermost resistance level associated with curve 533-1 (the 50 ns pulse) is L1, the lowermost resistance level associated with curve 533-2 (the 40 ns pulse) is L2, the lowermost resistance level associated with curve 533-3 (the 30 ns pulse) is L3, and the lowermost resistance level associated with curve 533-4 (the 20 ns pulse) is L4.

As such, the curves 531-1, 531-2, 533-1, 533-2, 533-3, and 533-4 can be used to determine a number of particular characteristics of the number of different programming pulses. For instance, the curves 531-1, 531-2, 533-1, 533-2, 533-3, and 533-4 can be used to determine the particular voltage magnitude at which the lowermost resistance level occurs for each of the different pulse widths, e.g., 200 ns, 100 ns, 50 ns, 40 ns, 30 ns, and 20 ns, in the example illustrated in FIG. 5A. The curves 531-1, 531-2, 533-1, 533-2, 533-3, and 533-4 can also be used to determine regions such as regions 537-1, 537-2, 537-3, and 537-4 at which the rate of change of the resistance versus programming voltage curve is minimized.

It is noted that the programming pulses applied to phase change memory cells to achieve the curves illustrated in FIG. 5A are fixed magnitude pulses having a fast rising edge and a fast falling edge. That is, the pulses are substantially rectangularly shaped pulses having a fixed magnitude but different pulse durations such as the pulses illustrated in FIG. 5B. Therefore, unlike in the example previous approach described in connection with FIGS. 3A and 3B, the falling edges of the programming pulses are not intentionally delayed to alter the quench time of the pulse, for instance.

One or more embodiments of the present disclosure can include determining a number of different programming pulses for programming a phase change memory cell to respective corresponding different intermediate resistance states between a reset state and a set state associated with the memory cell. In various embodiments, the different programming pulses can each include a rising edge that is substantially the same as a falling edge and a particular uppermost magnitude maintained for a duration which is dependent on a particular one of the different intermediate resistance states to which the particular programming pulse corresponds.

For instance, the embodiment illustrated in FIG. 5B includes a number of different programming pulses 536-1 (P1), 536-2 (P2), 536-3 (P3), and 536-4 (P4). Each of the pulses 536-1, 536-2, 536-3, and 536-4 have a different pulse width and correspond to a particular intermediate resistance state, e.g., 522-1, 522-2, 522-3, and 522-4, respectively. Legend 539 illustrates particular characteristics for each of the programming pulses 536-1, 536-2, 536-3, and 536-4 used to program a phase change memory cell to a resistance level, e.g., L1, L2, L3, and L4, corresponding to one of the intermediate resistance states 522-1, 522-2, 522-3, and 522-4, respectively. In the example shown in FIG. 5B, the legend 539 indicates a characteristic magnitude and duration for each of the pulses 536-1, 536-2, 536-3, and 536-4.

As illustrated in legend 539, programming pulse 536-1 has a magnitude of 2.6V and a duration of 50 ns, pulse 536-2 has a magnitude of 2.6V and a duration of 40 ns, pulse 536-3 has a magnitude of 2.7V and a duration of 30 ns, and pulse 536-4 has a magnitude of 2.9V and a duration of 20 ns. As shown in FIG. 5B, the pulses 536-1, 536-2, 536-3, and 536-4 provide for multiple intermediate states located between the reset state 522-R and the set state 522-S, with adequate separation therebetween. Adequate separation between adjacent intermediate resistance states, such as states 522-1, 522-2, 522-3, and 522-4, can be improved by selecting programming pulses having durations and magnitudes which coincide with the lowermost resistance levels associated with resistance versus voltage curves such as curves 533-1, 533-2, 533-3, and 533-4 shown in FIG. 5A. For instance, the pulse magnitude and duration associated with each of the pulses 536-1, 536-2, 536-3, and 536-4 can be selected to coincide with the regions 337-1, 337-2, 337-3, and 337-4 shown in FIG. 5A.

In this manner, in various embodiments of the present disclosure, multiple intermediate resistance states, such as states 522-1, 522-2, 522-3, and 522-4, can be obtained by applying pulses having different durations to phase change memory cells. In one or more embodiments, and as illustrated in FIG. 5B, each of the programming pulses used to program a cell to an intermediate resistance state can have a different duration, e.g., pulse width. In various embodiments, the duration of the programming pulses used to program a cell to an intermediate resistance state is different for at least two of the number of programming pulses. In one or more embodiments, and as illustrated in FIG. 5B, the particular magnitude of the programming pulses is different for at least two of the number of different programming pulses used to program a cell to multiple intermediate resistance states. In the example illustrated in FIG. 5B, the magnitude of pulse 536-1 is the same as the magnitude of pulse 536-2, although the duration of the pulses is different.

Embodiments of the present disclosure are not limited to the examples discussed in connection with FIGS. 5A and 5B. For instance, in one or more embodiments, the magnitude and duration of the programming pulses may not coincide with a lowermost resistance level associated with the resistance versus pulse voltage curves such as those shown in FIG. 5A. For instance, the magnitude and/or duration of the selected programming pulses used to program a cell to one of a number of intermediate resistance states may coincide with a partial set region or a partial reset region of curves such as those shown in FIG. 5A. However, selecting a pulse magnitude and duration corresponding to a lowermost portion of the curve can provide benefits such as increased programming accuracy, improved separation between adjacent intermediate states, and increased storage density, among other benefits.

With continued reference to FIG. 5B, in various embodiments, phase change memory cells to be programmed to a particular state can be placed in a reset state, e.g., 522-R, prior to having a programming pulse such as 536-1, 536-2, 536-3, and 536-4 applied thereto. Placing the cells in a reset state prior to programming the cell can result in benefits such as increased programming consistency by reducing or eliminating pulse accumulation effects. In one or more embodiments, a selected one of the programming pulses, e.g., 536-1, 536-2, 536-3, and 536-4, can then be applied to a cell in order to program the cell to one of the number intermediate states, e.g., 522-1, 522-2, 522-3, and 522-4, between the reset state, e.g., 522-R, and the set state, 522-S, associated with the cell. The selected programming pulse may include an uppermost magnitude that is applied to the cell for a particular duration. The particular duration can depend on to which of number of intermediate states the memory cell is to be programmed. In various embodiments, the magnitude of the selected programming pulse can be adjusted at least partially based on to which of the number of intermediate states the cell is to be programmed. For instance, a number of different magnitudes can each correspond to one of the number of intermediate states, and the particular magnitude applied to the cell can depend on the particular intermediate state to which the cell is to be programmed.

In one or more embodiments, a single programming pulse, e.g., 536-1, 536-2, 536-3, and 536-4, is applied to program the cell to one of the number of intermediate resistance states, e.g., 522-1, 522-2, 522-3, and 522-4. For instance, a single pulse such as pulse 536-2 (P2) can be applied to a cell to program the cell to intermediate resistance state 522-2 (R2). As noted above, in one or more embodiments, the duration of the rising edge of the programming pulse is substantially the same as the duration of the falling edge of the pulse, e.g., the programming pulses can be relatively rectangularly shaped pulses such as pulses 536-1, 536-2, 536-3, and 536-4 shown in FIG. 5B. In one or more embodiments, programming pulses, e.g., 536-1, 536-2, 536-3, and 536-4, can be followed by a program verify operation. As one of ordinary skill in the art will appreciate, a program verify operation can include performing a sensing operation to determine the resistance level of the cell after the programming pulse. The sensing operation can be followed by one or more subsequent programming pulses that can be used to further adjust the resistance level of the cell to the desired state. Such verify operations can be used to further narrow the resistance distributions corresponding to the resistance states, e.g., 522-1, 522-2, 522-3, and 522-4.

One or more embodiments of the present disclosure include determining the particular characteristics of the number of different programming pulses used to program phase change memory cells to multiple intermediate states. For instance, one or more embodiments include determining, for each of the different programming pulses, a particular pulse duration and magnitude associated with the pulse. As an example, a number of reference phase change memory cells in an array of cells can be sampled to determine the particular characteristics of the number of different programming pulses, e.g., pulses 536-1, 536-2, 536-3, and 536-4 shown in FIG. 5B.

In various embodiments, sampling a number of reference cells can include, for each of the intermediate resistance states, e.g., states 522-1, 522-2, 522-3, and 522-4 shown in FIG. 5B, applying a number of signal pulses to the reference cells, and, for each of the number of signal pulses applied to the reference cells, determining a particular resistance level reached by the reference cells in response to a particular magnitude and particular duration of the applied signal pulse. For instance, in reference to FIG. 5A, sampling a number of reference cells can include determining a particular resistance level, e.g., L1, reached by the reference cells in response to a particular magnitude, e.g., 2.5V, and a particular duration, e.g., 50 ns, of the applied signal pulse. As described above, one or more embodiments can include, for each of the number of different programming pulses, determining the particular uppermost magnitude and duration for which the particular uppermost magnitude is maintained based on a lowermost resistance level of the determined resistance levels for the number of signal pulses applied to the reference phase change memory cells. That is, the fixed pulse magnitude and duration can be determined based on the lowermost resistance level associated with a curve such as curves 533-1, 533-2, 533-3, and 533-4 shown in FIG. 5A.

In one or more embodiments of the present disclosure, a data value stored by the phase change memory cell can be determined prior to applying a selected one of the number of different programming pulses to the cell. That is, a read operation can be performed on the cell prior to performing a programming operation on the cell. In such embodiments, the selected one of the number of different programming pulses may be applied to the cell only if the data value stored by the cell is different than a data value associated with the corresponding intermediate resistance state. For instance, if the cell is being programmed to intermediate resistance state 522-3 (R3), a read operation can be performed on the cell to determine whether the resistance of the cell presently corresponds to state R3, and if so, pulse 536-3 (the pulse corresponding to resistance state R3) is not applied to the cell. As an example, assume state R3 corresponds to a logical value of "10." If the read operation determines that the phase change memory cell to be programmed already stores logical "10," then the programming pulse is not applied to the cell. Performing a read operation prior to applying the selected programming pulse can reduce the number of programming pulses applied to the cell, which can increase the useful life of the cell, among other benefits.

Figure 6:
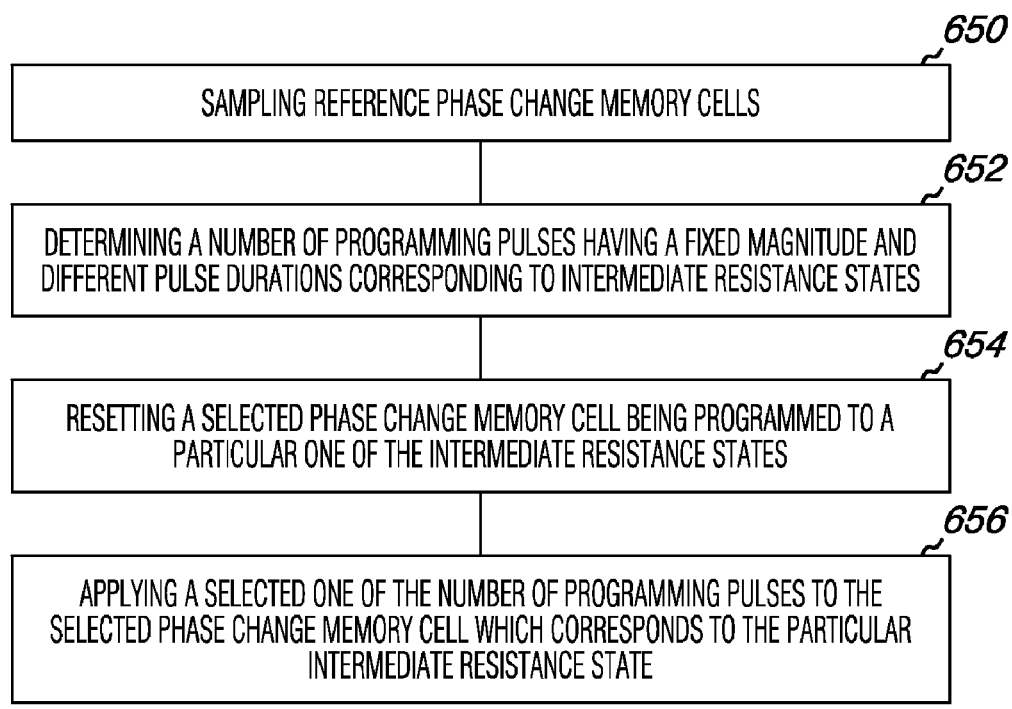
FIG. 6 illustrates a method of operating a phase change memory device according to an embodiment of the present disclosure.

FIG. 6 illustrates a method of operating a phase change memory device according to an embodiment of the present disclosure. However, embodiments are not limited to the example illustrated in FIG. 6.

At block 650, the method includes sampling reference phase change memory cells. The reference cells can include a number of cells within an array of phase change memory cells and can be physically identical to non-reference cells, e.g., cells used to store user data. In one or more embodiments, a number of phase change memory cells can be used both as reference cells and data cells. In one or more embodiments, and as discussed above in connection with FIGS. 5A and 5B, sampling the reference cells can include, for each of a number of intermediate resistance states, e.g., states 522-1, 522-2, 522-3, and 522-4 shown in FIG. 5B, applying a number of signal pulses to the reference cells, and, for each of the number of signal pulses applied to the reference cells, determining a particular resistance level reached by the reference cells in response to a particular magnitude and particular duration of the applied signal pulse.

At block 652, the method includes determining a number of programming pulses having a fixed magnitude and different pulse durations corresponding to the number of intermediate resistance states. The particular fixed magnitude and duration associated with each of the different programming pulses, e.g., pulses 536-1, 536-2, 536-3, and 536-4 shown in FIG. 5B, can be determined based on the sampling of the reference cells. As discussed above, and as shown in FIG. 5A, the durations of the different programming pulses can be selected so as to coincide with a lowermost resistance level associated with the different applied pulse voltages for each of a number of different programming pulse durations.

At block 654, the method includes resetting a selected phase change memory cell being programmed to a particular one of the intermediate states, e.g., states 522-1, 522-2, 522-3, and 522-4 shown in FIG. 5B. Resetting the cell can include applying a reset pulse to the selected cell to place the cell in a highly resistive amorphous state, e.g., reset state 522-R shown in FIG. 5B.

At block 656, the method includes applying a selected one of the number of programming pulses to the selected phase change memory cell which corresponds to the particular intermediate resistance state. As described herein, in various embodiments, the duration of the selected programming pulse is different for each of the number of programming pulses. That is, a particular duration for which an uppermost magnitude of the pulse is applied to the cell varies depending on to which of the number of intermediate states the memory cell is to be programmed.

One or more embodiments of the present disclosure can provide improved multilevel programming of phase change memory cells as compared to previous approaches such as those described in connection with FIGS. 3A, 3B, and 4. For instance, programming phase change memory cells in accordance with embodiments described herein can result in improved programming consistency which can result in increased data storage density due to improved, e.g., narrower, resistance distributions, among other benefits.

Figure 7:
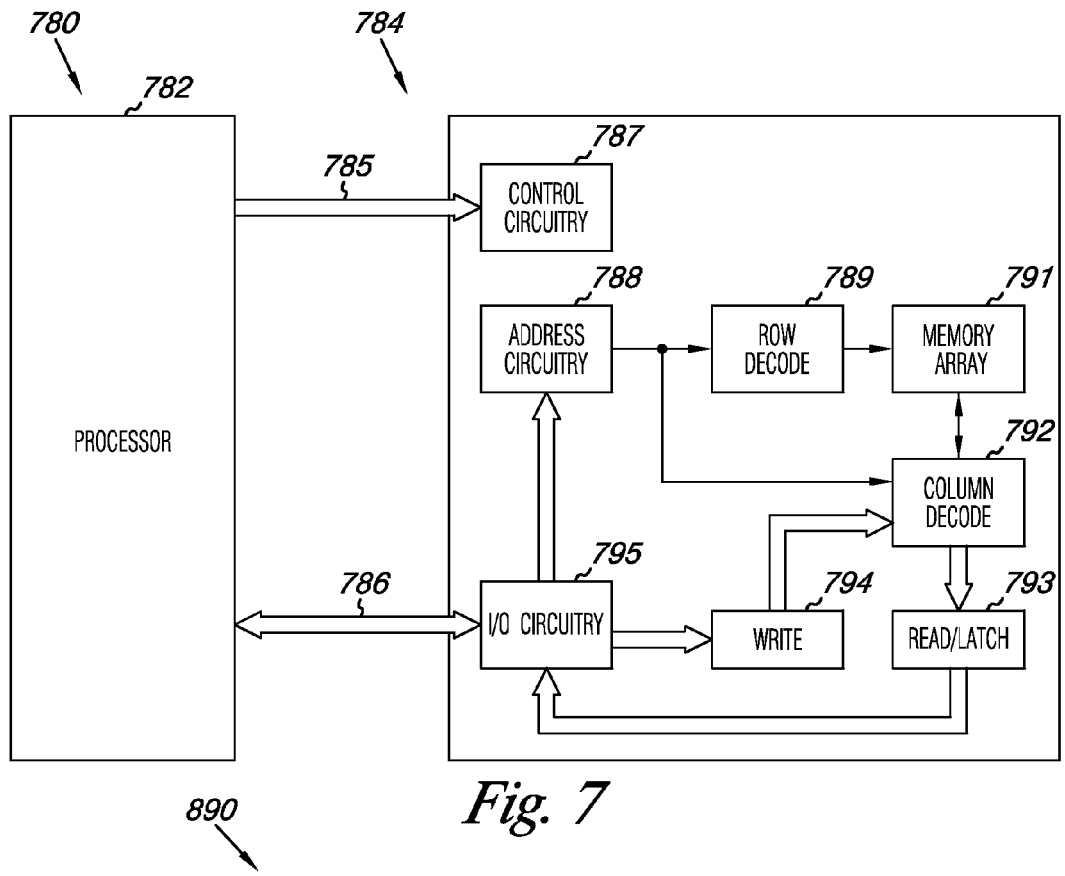
FIG. 7 is a functional block diagram of an electronic memory system having at least one memory device operated in accordance with an embodiment of the present disclosure.

FIG. 7 is a functional block diagram of an electronic memory system 780 having at least one memory device operated in accordance with an embodiment of the present disclosure. Memory system 780 includes a processor 782 coupled to a non-volatile memory device 784 that includes a memory array 791 of phase change memory cells, e.g., phase change array 100 described in connection with FIG. 1. The memory system 780 can include separate integrated circuits or both the processor 782 and the memory device 784 can be on the same integrated circuit. The processor 782 can be a microprocessor or some other type of controlling circuitry such as an application-specific integrated circuit (ASIC).

The array 791 of phase change memory cells can be organized according to various architectures known in the art. As an example, the access devices of each row of memory cells are coupled with a word line, while phase change memory elements of the memory cells are coupled to bit lines.

The embodiment of FIG. 7 includes address circuitry 788 to latch address signals provided over I/O connections 786 through I/O circuitry 795. Address signals are received and decoded by a row decoder 789 and a column decoder 792 to access the memory array 791.

The memory array 791 can include phase change memory cell structures according to embodiments described herein. The memory device 784 reads data in the memory array 791 by sensing voltage and/or current changes in the memory array columns using sense/buffer circuitry that in this embodiment can be read/latch circuitry 793. The read/latch circuitry 793 can be coupled to read and latch data from the memory array 791. I/O circuitry 795 is included for bi-directional data communication over the I/O connections 786 with the processor 782. Write circuitry 794 is included to write data to the memory array 791.

Control circuitry 787 decodes signals provided by control connections 785 from the processor 782. These signals can include chip signals, write enable signals, and address latch signals that are used to control the operations on the memory array 791, including data read, data write, and data erase operations. In various embodiments, the control circuitry 787 is responsible for executing instructions from the processor 782 to perform the operating and programming embodiments of the present disclosure. The control circuitry 787 can be a state machine, a sequencer, or some other type of controller. It will be appreciated by those skilled in the art that circuitry and/or signals in addition to those shown in FIG. 7 can be provided.

Figure 8:
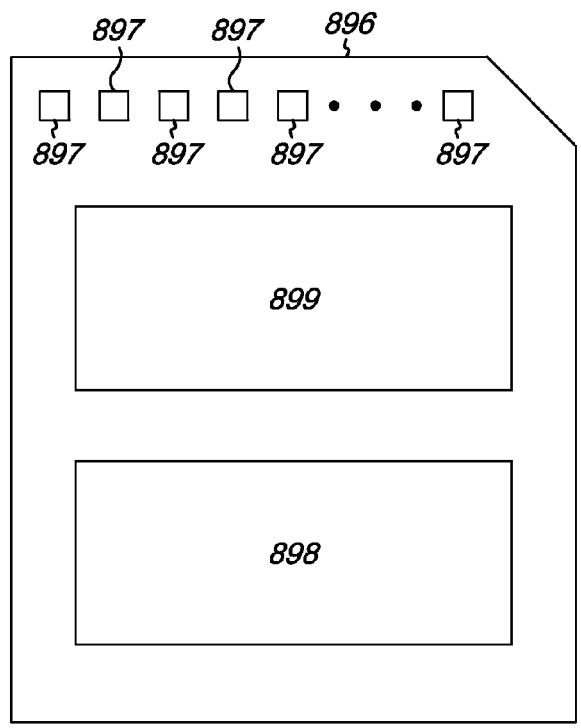
FIG. 8 is a functional block diagram of a memory module having at least one memory device operated in accordance with an embodiment of the present disclosure.

FIG. 8 is a functional block diagram of a memory module 890 having at least one memory device operated in accordance with an embodiment of the present disclosure. Memory module 890 is illustrated as a memory card, although the concepts discussed with reference to memory module 890 are applicable to other types of removable or portable memory (e.g., USB PCRAM drives) and are intended to be within the scope of "memory module" as used herein. In addition, although one example form factor is depicted in FIG. 8, these concepts are applicable to other form factors as well.

In some embodiments, memory module 890 will include a housing 896 (as depicted) to enclose one or more memory devices 898, though such a housing is not essential to all devices or device applications. At least one memory device 898 includes an array of phase change memory cells according to embodiments described herein. Where present, the housing 896 includes one or more contacts 897 for communication with a host device. Examples of host devices include digital cameras, digital recording and playback devices, PDAs, personal computers, memory card readers, interface hubs and the like.

For some embodiments, the contacts 897 are in the form of a standardized interface. For example, with a USB PCRAM drive, the contacts 897 might be in the form of a USB Type-A male connector. For some embodiments, the contacts 897 may be in the form of a semi-proprietary interface. In general, however, contacts 897 provide an interface for passing control, address and/or data signals between the memory module 890 and a host having compatible receptors for the contacts 897.

The memory module 890 may optionally include additional circuitry 899, which may be one or more integrated circuits and/or discrete components. For some embodiments, the additional circuitry 899 may include a memory controller for controlling access across multiple memory devices 898 and/or for providing a translation layer between an external host and a memory device 898. For example, there may not be a one-to-one correspondence between the number of contacts 897 and a number of connections to the one or more memory devices 898. Thus, a memory controller could selectively couple an I/O connection (not shown in FIG. 8) of a memory device 898 to receive the appropriate signal at the appropriate I/O connection at the appropriate time or to provide the appropriate signal at the appropriate contact 897 at the appropriate time.

Similarly, the communication protocol between a host and the memory module 890 may be different than what is required for access of a memory device 898. A memory controller could then translate the command sequences received from a host into the appropriate command sequences to achieve the desired access to the memory device 898. Such translation may further include changes in signal voltage levels in addition to command sequences.

The additional circuitry 899 may further include functionality unrelated to control of a memory device 898 such as logic functions as might be performed by an ASIC. Also, the additional circuitry 899 may include circuitry to restrict read or write access to the memory module 890, such as password protection, biometrics or the like.

The additional circuitry 899 may include circuitry to indicate a status of the memory module 890. For example, the additional circuitry 899 may include functionality to determine whether power is being supplied to the memory module 890 and whether the memory module 890 is currently being accessed, and to display an indication of its status, such as a solid light while powered and a flashing light while being accessed. The additional circuitry 899 may further include passive devices, such as decoupling capacitors to help regulate power requirements within the memory module 890.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a phase change memory device, comprising:
    placing a phase change memory cell in a reset state; and
    applying a selected programming pulse of a number of programming pulses to the phase change memory cell in order to program the cell to one of a number of intermediate states between the reset state and a set state associated with the cell, each of the number of programming pulses associated with a respective different one of the number of intermediate states;
    determining a data value stored by the phase change memory cell prior to applying the selected programming pulse to the cell; and
    applying the selected programming pulse to the cell only if the data value stored by the cell is different than a data value associated with the one of the number of intermediate states to which the selected programming pulse of the number of programming pulses corresponds.

2. The method of claim 1, including adjusting the uppermost magnitude of the selected programming pulse at least partially based on to which one of the number of intermediate states the memory cell is to be programmed.

3. The method of claim 1, wherein applying the selected programming pulse to the phase change memory cell in order to program the cell to one of the number of intermediate states includes using a single programming pulse.

4. The method of claim 3, wherein a duration of a rising edge of the single programming pulse is substantially the same as a duration of a falling edge of the single programming pulse.

5. The method of claim 1, including applying a reset pulse to the phase change memory cell to place the cell in the reset state prior to applying the selected programming pulse.

6. A method for operating a phase change memory device, comprising:
    determining a number of different programming pulses for programming a phase change memory cell to respective corresponding different intermediate resistance states between a reset state and a set state associated with the memory cell;
    sampling a number of reference phase change memory cells to determine a number of particular characteristics of the number of different programming pulses;
    wherein the number of different programming pulses each include:
        a rising edge that is substantially the same as a falling edge; and
        a particular uppermost magnitude maintained for a duration which is dependent on a particular one of the different intermediate resistance states to which the particular programming pulse corresponds; and
    applying a selected one of the number of different programming pulses to the phase change memory cell to program the cell to the corresponding intermediate resistance state from the reset state.

7. The method of claim 6, wherein sampling the number of reference phase change memory cells includes:
    for each of the intermediate resistance states, applying a number of signal pulses to the reference cells; and
    for each of the number of signal pulses applied to the reference cells, determining a particular resistance level reached by the reference cells in response to a particular magnitude and particular duration of the applied signal pulse.

8. The method of claim 7, including, for each of the number of different programming pulses, determining the particular uppermost magnitude and duration for which the particular uppermost magnitude is maintained based on the sampling of the number of reference phase change memory cells.

9. The method of claim 7, including, for each of the number of different programming pulses, determining the particular uppermost magnitude and duration for which the particular uppermost magnitude is maintained based on a lowermost resistance level of the determined resistance levels for the number of signal pulses applied to the reference phase change memory cells.

10. The method of claim 6, including, for each of the number of different programming pulses, determining the particular uppermost magnitude, wherein the particular pulse magnitude is different for at least two of the number of different programming pulses.

11. The method of claim 6, wherein the number of intermediate resistance states is at least two and wherein the duration for which the particular uppermost magnitude is maintained is different for at least two of the number of different programming pulses.

12. The method of claim 6, including:
    determining a data value stored by the phase change memory cell prior to applying the selected one of the number of different programming pulses to the cell; and
    applying the selected one of the number of different programming pulses to the cell only if the data value stored by the cell is different than a data value associated with the corresponding intermediate resistance state.

13. A phase change memory device, comprising:
an array of phase change memory cells; and
programming circuitry coupled to the array and configured to:
- sample a number of reference phase change memory cells to determine a number of particular characteristics of a number of different programming pulses used for programming a phase change memory cell to a number of different intermediate resistance states between a reset state and a set state associated with the memory cell;
- place the phase change memory cell in the reset state; and
- apply a selected programming pulse to the phase change memory cell in order to program the memory cell to one of the number of intermediate states between the reset state and the set state associated with the memory cell;
- wherein the selected programming pulse includes an uppermost magnitude applied for a particular duration, the particular duration depending on to which one of the number of intermediate states the memory cell is to be programmed.

14. The device of claim 13, wherein the programming circuitry is configured to adjust the uppermost magnitude of the selected programming pulse at least partially based on to which one of the number of intermediate states the memory cell is to be programmed.

15. The device of claim 13, wherein a single programming pulse is applied to the phase change memory cell in order to program the cell to one of the number of intermdiate states.

16. The device of claim 15, wherein a duration of a rising edge of the single programming pulse is substantially the same as a duration of a falling edge of the single programming pulse.

17. The device of claim 13, wherein the programming circuitry is configured to apply a reset pulse to the phase change memory cell to place the cell in the reset state prior to applying the selected programming pulse.

18. A memory device, comprising:
an array of multilevel phase change memory cells;
control circuitry coupled to the array and configured to:
- generate a number of different fixed magnitude programming pulses each corresponding to a respective different intermediate resistance state between a reset state and a set state associated with the cells; and
- apply a selected one of the number of different fixed magnitude programming pulses to a selected phase change memory cell in order to program the cell from the reset state to the intermediate state to which the selected one of the number of different fixed magnitude programming pulses corresponds;
- determine a data value stored by the selected phase change memory cell prior to applying the selected one of the number of different fixed magnitude programming pulses to the cell; and
- apply the selected one of the number of different fixed magnitude programming pulses to the cell only if the data value stored by the cell is different than a data value associated with the intermediate resistance state to which the selected one of the number of different fixed magnitude programming pulses corresponds;
- wherein each of the number of different fixed magnitude programming pulses has a different duration.

19. The device of claim 18, wherein at least two of the number of different fixed magnitude programming pulses have different magnitudes.

20. The device of claim 18, wherein the control circuitry is configured to sample a number of reference phase change memory cells in the array to determine a number of particular characteristics of the number of different fixed magnitude programming pulses.

21. The device of claim 18, wherein each of the number of different fixed magnitude programming pulses include a rising edge that is substantially the same as a falling edge.

22. A memory device comprising:
an array of phase change memory cells; and
control circuitry coupled to the array and configured to:
- determine a number of different programming pulses for programming a phase change memory cell to respective corresponding different intermediate resistance states between a reset state and a set state associated with the memory cell;
- sample a number of reference phase change memory cells in the array to determine a number of particular characteristics of the number of different programming pulses;
- wherein the number of different programming pulses each include:
  - a rising edge that is substantially the same as a falling edge; and
  - a particular uppermost magnitude maintained for a duration which is dependent on a particular one of the different intermediate resistance states to which the particular programming pulse corresponds; and
- apply a selected one of the number of different programming pulses to the phase change memory cell to program the cell to the corresponding intermediate resistance state from the reset state.

23. The device of claim 22, wherein the control circuitry is configured to, for each of the number of different programming pulses, determine the particular uppermost magnitude, wherein the particular pulse magnitude is different for at least two of the number of different programming pulses.

24. The device of claim 22, wherein the number of intermediate resistance states is at least three and wherein the duration for which the particular uppermost magnitude is maintained is different for at least two of the number of different programming pulses.

* * * * *

UNITED STATES PATENT AND TRADEMARK OFFICE
CERTIFICATE OF CORRECTION

PATENT NO. : 8,116,115 B2  
APPLICATION NO. : 12/266447  
DATED : February 14, 2012  
INVENTOR(S) : Jun Liu et al.

Page 1 of 1

It is certified that error appears in the above-identified patent and that said Letters Patent is hereby corrected as shown below:

On the Title Page, Item (74), in "Attorney, Agent, or Firm", line 2, delete "Huebach," and insert -- Huebsch, --, therefor.

In column 15, line 33, in Claim 15, delete "intermdiate" and insert -- intermediate --, therefor.

Signed and Sealed this
Tenth Day of April, 2012

David J. Kappos
*Director of the United States Patent and Trademark Office*